(12) United States Patent
Yu et al.

(10) Patent No.: US 7,612,405 B2
(45) Date of Patent: Nov. 3, 2009

(54) FABRICATION OF FINFETS WITH MULTIPLE FIN HEIGHTS

(75) Inventors: Chen-Hua Yu, Hsin-Chu (TW); Chen-Nan Yeh, Hsin-Chih (TW); Chu-Yun Fu, Taipei (TW); Yu-Rung Hsu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 220 days.

(21) Appl. No.: 11/714,644

(22) Filed: Mar. 6, 2007

(65) Prior Publication Data

US 2008/0230852 A1 Sep. 25, 2008

(51) Int. Cl.
*H01L 29/76* (2006.01)

(52) U.S. Cl. .................. 257/328; 257/397; 257/401; 257/E29.267

(58) Field of Classification Search .......... 257/328, 257/332, 397, E29.267, 382, 401; 438/270, 438/272

See application file for complete search history.

(56) References Cited

U.S. PATENT DOCUMENTS

| | | | |
|---|---|---|---|
| 6,252,284 B1 | 6/2001 | Muller et al. | |
| 6,413,802 B1 | 7/2002 | Hu et al. | |
| 6,642,090 B1* | 11/2003 | Fried et al. | 438/164 |
| 6,909,147 B2 | 6/2005 | Aller et al. | |
| 7,196,380 B2 | 3/2007 | Anderson et al. | |
| 7,256,078 B2 | 8/2007 | Anderson et al. | |
| 7,382,020 B2 | 6/2008 | Liu et al. | |
| 2004/0052948 A1* | 3/2004 | Gronbeck et al. | 427/299 |
| 2006/0088967 A1* | 4/2006 | Hsiao et al. | 438/296 |
| 2006/0234456 A1* | 10/2006 | Anderson et al. | 438/284 |
| 2006/0270181 A1* | 11/2006 | Sandhu et al. | 438/424 |
| 2007/0099353 A1 | 5/2007 | Thean et al. | |
| 2007/0161171 A1 | 7/2007 | Burnett et al. | |
| 2008/0006852 A1 | 1/2008 | Beintner et al. | |
| 2008/0128797 A1 | 6/2008 | Dyer et al. | |
| 2008/0230852 A1 | 9/2008 | Yu et al. | |

OTHER PUBLICATIONS

Doyle, B.S., et al., "High Performance Fully-Depleted Tri-Gate CMOS Transistors," IEEE Electron Device Letters, vol. 24, No. 4, Apr. 2003, pp. 263-265.
Shang, H., et al., "Investigation of FinFET Devices for 32nm Technologies and Beyond," Symposium on VLSI Technology Digest of Technical Papers, 2006, 2 pgs.

* cited by examiner

Primary Examiner—Tuan N. Quach
(74) Attorney, Agent, or Firm—Slater & Matsil, L.L.P.

(57) ABSTRACT

A semiconductor structure includes a first semiconductor strip extending from a top surface of the semiconductor substrate into the semiconductor substrate, wherein the first semiconductor strip has a first height. A first insulating region is formed in the semiconductor substrate and surrounding a bottom portion of the first semiconductor strip, wherein the first insulating region has a first top surface lower than a top surface of the first semiconductor strip. A second semiconductor strip extends from a top surface of the semiconductor substrate into the semiconductor substrate, wherein the second semiconductor strip has a second height greater than the first height. A second insulating region is formed in the semiconductor substrate and surrounding a bottom portion of the second semiconductor strip, wherein the second insulating region has a second top surface lower than the first top surface, and wherein the first and the second insulating regions have substantially same thicknesses.

20 Claims, 11 Drawing Sheets

FABRICATION OF FINFETS WITH MULTIPLE FIN HEIGHTS

TECHNICAL FIELD

This invention relates generally to semiconductor devices, and more particularly to Fin field effect transistors (FinFET), and even more particularly to the structure and formation methods of FinFETs with different fin heights.

BACKGROUND

Transistors are key components of modem integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing sizes of semiconductor devices. Fin field effect transistors (FinFET) are thus formed. FIG. 1 illustrates a perspective view of a conventional FinFET. Fin 4 is formed as a vertical silicon fin extending above substrate 2, and is used to form source and drain regions 6 and a channel region therebetween (not shown). A vertical gate 8 intersects the channel region of fin 4. While not shown in FIG. 1, a gate dielectric separates the channel region from vertical gate 8. FIG. 1 also illustrates oxide layer 18, and insulating sidewall spacers 12 and 14 formed on source and drain regions 6 and vertical gate 8, respectively. The ends of fin 4 receive source and drain doping implants that make these portions of fin 4 conductive. The channel region of fin 4 is also doped.

In the FinFET as shown in FIG. 1, the channel width is close to W+2H, wherein W is the width of fin 4, and H is the height of fin 4. The drive currents of FinFETs are thus increased without incurring the penalty of chip area. However, in conventional schemes for forming FinFETs, all FinFETs on a given chip have the same fin height, limiting the capability for customizing the performance of FinFETs. A solution is thus needed.

SUMMARY OF THE INVENTION

In accordance with one aspect of the present invention, a semiconductor structure includes a first semiconductor strip extending from a top surface of the semiconductor substrate into the semiconductor substrate, wherein the first semiconductor strip has a first height. A first insulating region is formed in the semiconductor substrate and surrounding a bottom portion of the first semiconductor strip, wherein the first insulating region has a first top surface lower than a top surface of the first semiconductor strip. A second semiconductor strip extends from a top surface of the semiconductor substrate into the semiconductor substrate, wherein the second semiconductor strip has a second height greater than the first height. A second insulating region is formed in the semiconductor substrate and surrounding a bottom portion of the second semiconductor strip, wherein the second insulating region has a second top surface lower than the first top surface, and wherein the first and the second insulating regions have substantially same thicknesses.

In accordance with another aspect of the present invention, a semiconductor structure includes a first trench in a semiconductor substrate, wherein the first trench encircles a first semiconductor fin, and a first oxide region underlying the first trench. A second trench is formed in the semiconductor substrate, wherein the second trench encircles a second semiconductor fin, and wherein a bottom surface of the second trench is lower than a bottom surface of the first trench. A second oxide region is formed underlying the second trench.

In accordance with yet another aspect of the present invention, a semiconductor chip includes a semiconductor substrate having a top surface, and a first and a second semiconductor strip in the semiconductor substrate. Top surfaces of the first and the second semiconductor strips are level with the top surface of the semiconductor substrate. A first insulating region encircles a bottom portion of the first semiconductor strip, wherein the first insulating region is recessed from the top surface of the semiconductor substrate by a first distance. A second insulating region encircles a bottom portion of the second semiconductor strip, wherein the second insulating region is recessed from the top surface of the semiconductor substrate by a second distance greater than the first distance.

In accordance with yet another aspect of the present invention, a method for forming a semiconductor structure includes providing a semiconductor substrate and forming a first trench in the semiconductor substrate, wherein the first trench encircles a first semiconductor fin. A first oxide region is formed underlying and substantially aligned to the first trench. A second trench is formed in the semiconductor substrate, wherein the second trench encircles a second semiconductor fin, and wherein a bottom of the second trench is lower than a bottom of the first trench. The method further includes forming a second oxide region underlying and substantially aligned to the second trench.

In accordance with yet another aspect of the present invention, a method for forming a semiconductor structure includes providing a semiconductor substrate and forming a mask layer over the semiconductor substrate. The method further includes forming and patterning a first photoresist; and etching the mask layer and the semiconductor substrate to form a first trench, wherein the first trench encircles a first semiconductor fin. The first photoresist is then removed. A second photoresist is formed and patterned. The mask layer and the semiconductor substrate are etched to form a second trench, wherein the second trench encircles a second semiconductor fin, and wherein a bottom surface of the second trench is lower than a bottom surface of the first trench. The second photoresist is then removed. The method further includes implanting oxygen ions into semiconductor substrate regions in the first and second trenches. An annealing is then performed to convert oxygen implanted regions of the semiconductor substrate into a first and a second oxide region. The mask layer is then removed.

The advantageous features of the present invention include customized fin heights of semiconductor fins, so that the FinFETs may have customized performance.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2 through 7A are cross-sectional views of intermediate stages in the manufacturing of an embodiment of the present invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming semiconductor fins with different heights on a same semiconductor chip is provided. The intermediate stages of manufacturing a preferred embodiment of the present invention are illustrated. Throughout the various views and illustrative embodiments of the present invention, like reference numbers are used to designate like elements.

Figure 1:
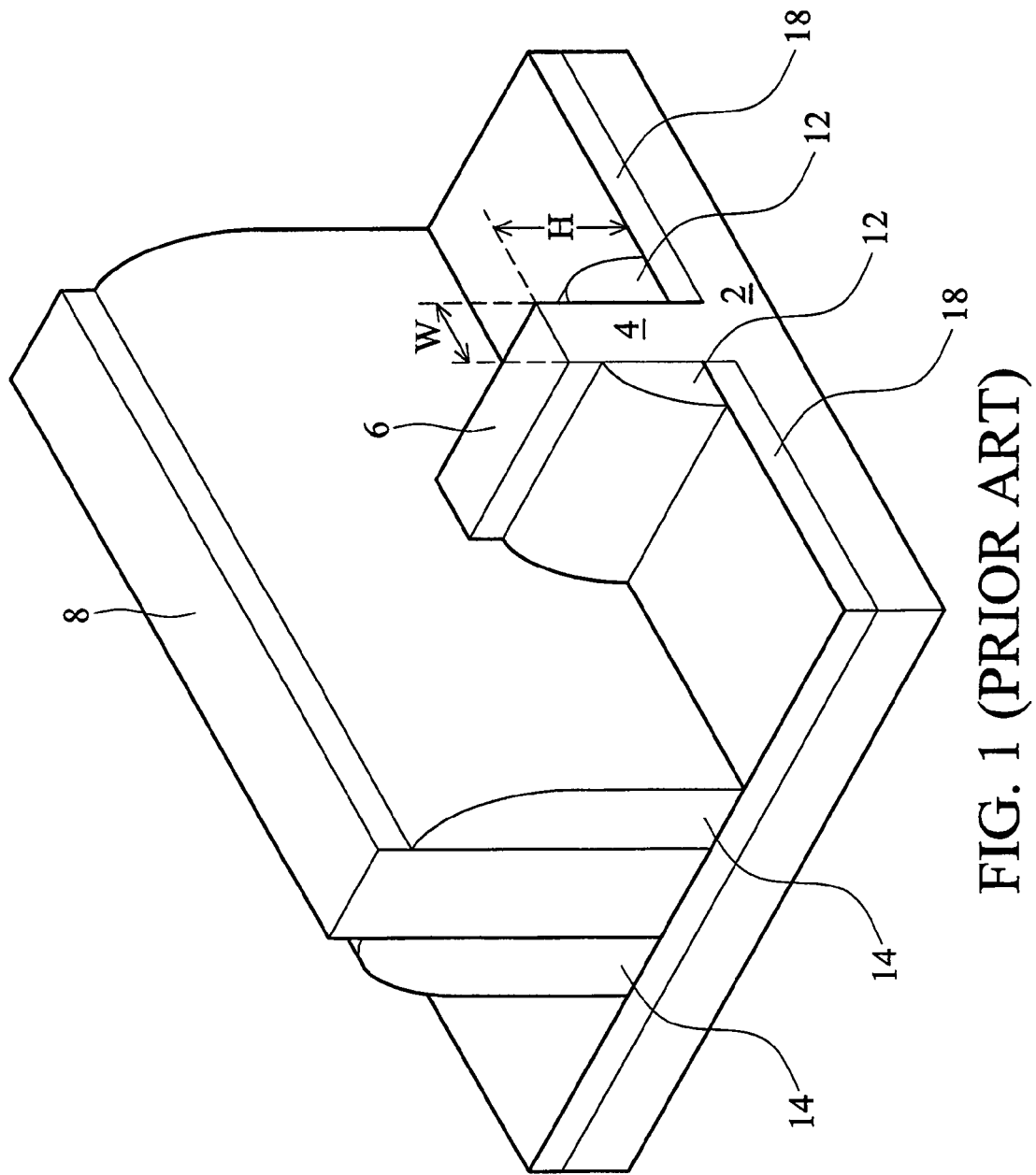
FIG. 1 illustrates a perspective view of a conventional Fin field effect transistor (FinFET)
Figure 2:
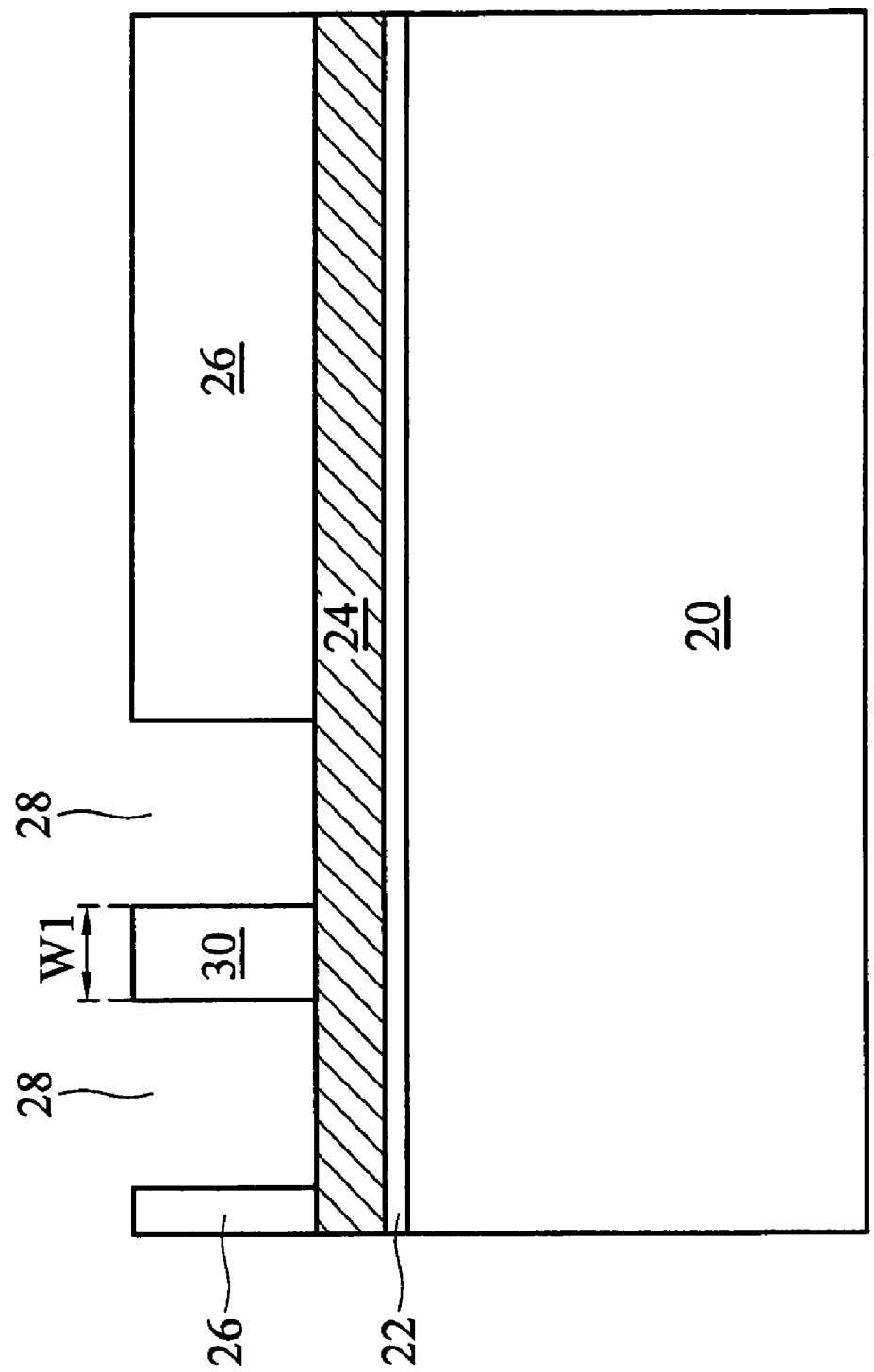

Referring to FIG. 2, semiconductor substrate 20 is provided. In the preferred embodiment, semiconductor substrate 20 includes silicon. Other commonly used materials, such as carbon, germanium, gallium, arsenic, nitrogen, aluminum, indium, and/or phosphorus, and the like, and combinations thereof, may also be included in semiconductor substrate 20. Semiconductor substrate 20 may be in the form of a single crystal or compound materials.

An optional pad layer 22 and mask layer 24 are formed on semiconductor substrate 20. Pad layer 22 is preferably a thin film formed through a thermal process, and thus comprising silicon oxide. It is used to buffer semiconductor substrate 20 and mask layer 24 so that less stress is generated. Pad layer 22 may also act as an etch stop layer for etching the subsequently formed mask layer 24. In the preferred embodiment, mask layer 24 is formed of silicon nitride using low-pressure chemical vapor deposition (LPCVD). In other embodiments, mask layer 24 is formed by thermal nitridation of silicon, plasma enhanced chemical vapor deposition (PECVD) or plasma anodic nitridation using nitrogen-hydrogen.

Photoresist 26 is formed on mask layer 24, and is then patterned, forming openings 28 in photoresist 26. The patterned photoresist 26 includes a photoresist strip 30. If viewed from the top of the structure shown in FIG. 2, photoresist strip 30 may be a rectangular-shaped strip isolated from other portions of photoresist 26 by openings 28. Width W1 of photoresist strip 30 preferably equals to the desired width of a fin of a FinFET. In an exemplary embodiment, width W1 is between about 15 nm and about 60 nm.

Figure 3:
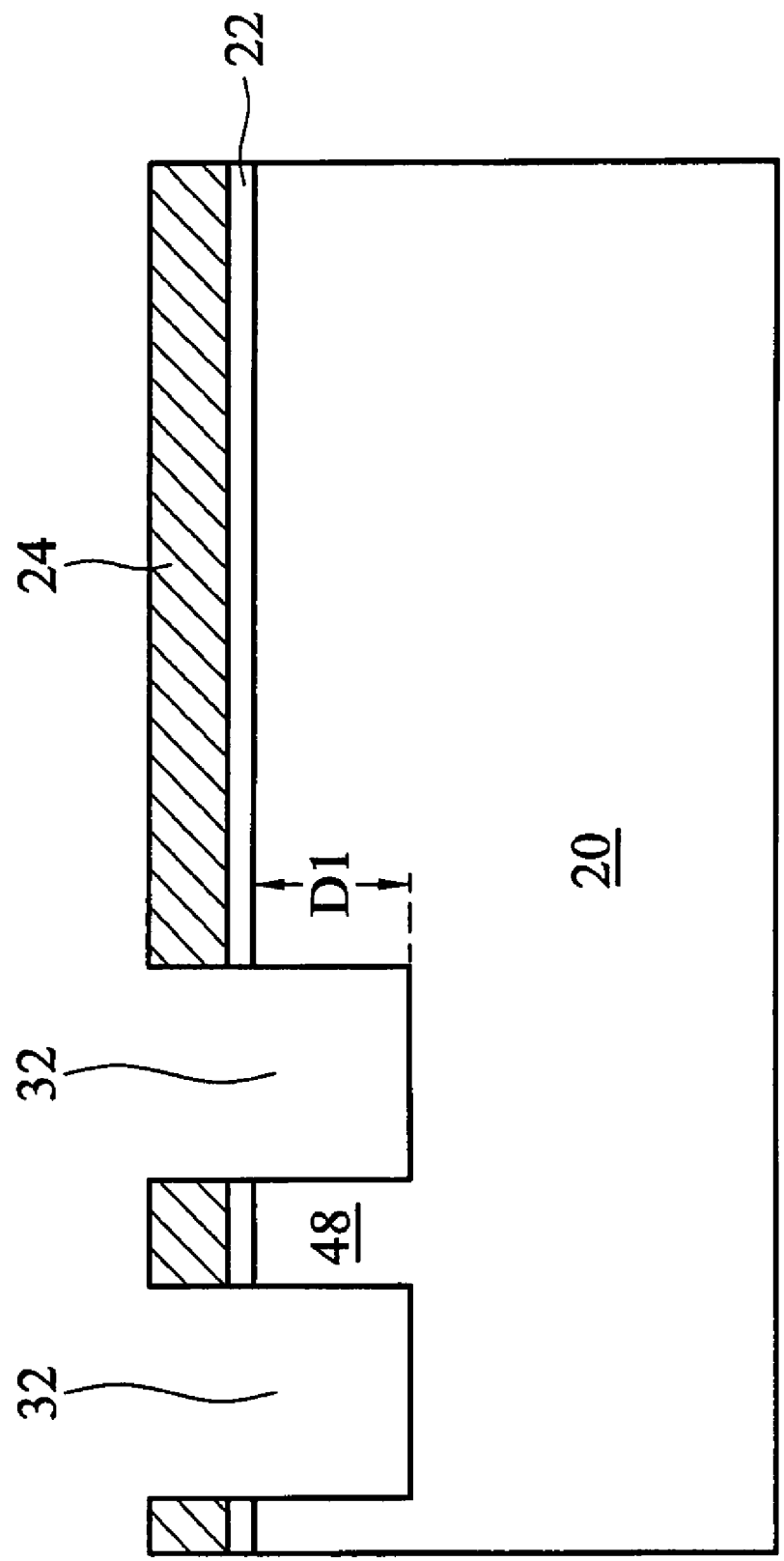

In FIG. 3, mask layer 24 and pad layer 22 are etched through openings 28, exposing underlying semiconductor substrate 20. The exposed semiconductor substrate 20 is then etched, forming trenches 32 in semiconductor substrate 20. In an exemplary embodiment, depth D1 of trenches 32 is substantially close to the desired height of the fin of the desired FinFET. Trenches 32 encircle fin 48 therebetween. Photoresist 26 is then removed.

Figure 4:
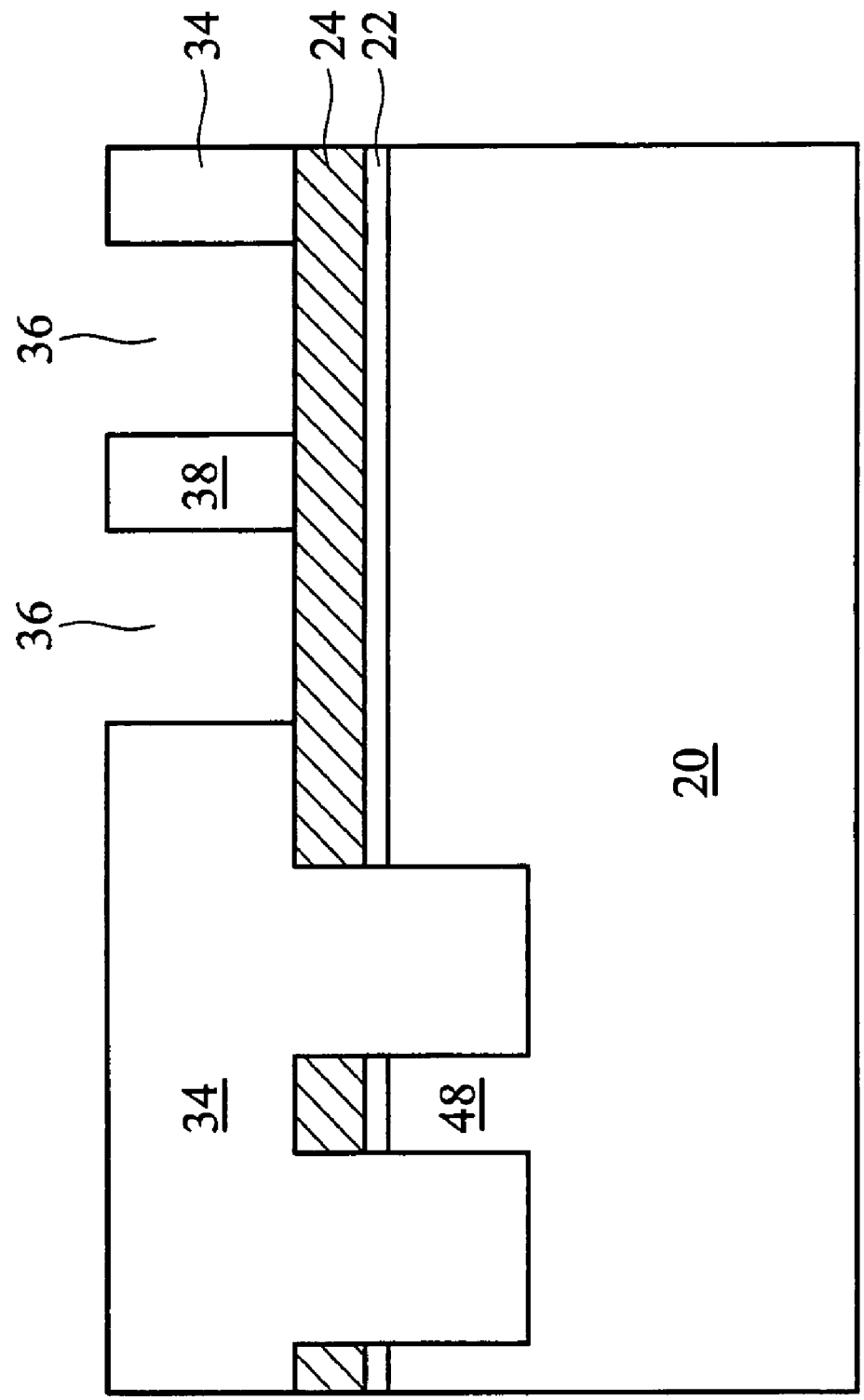
Figure 5:
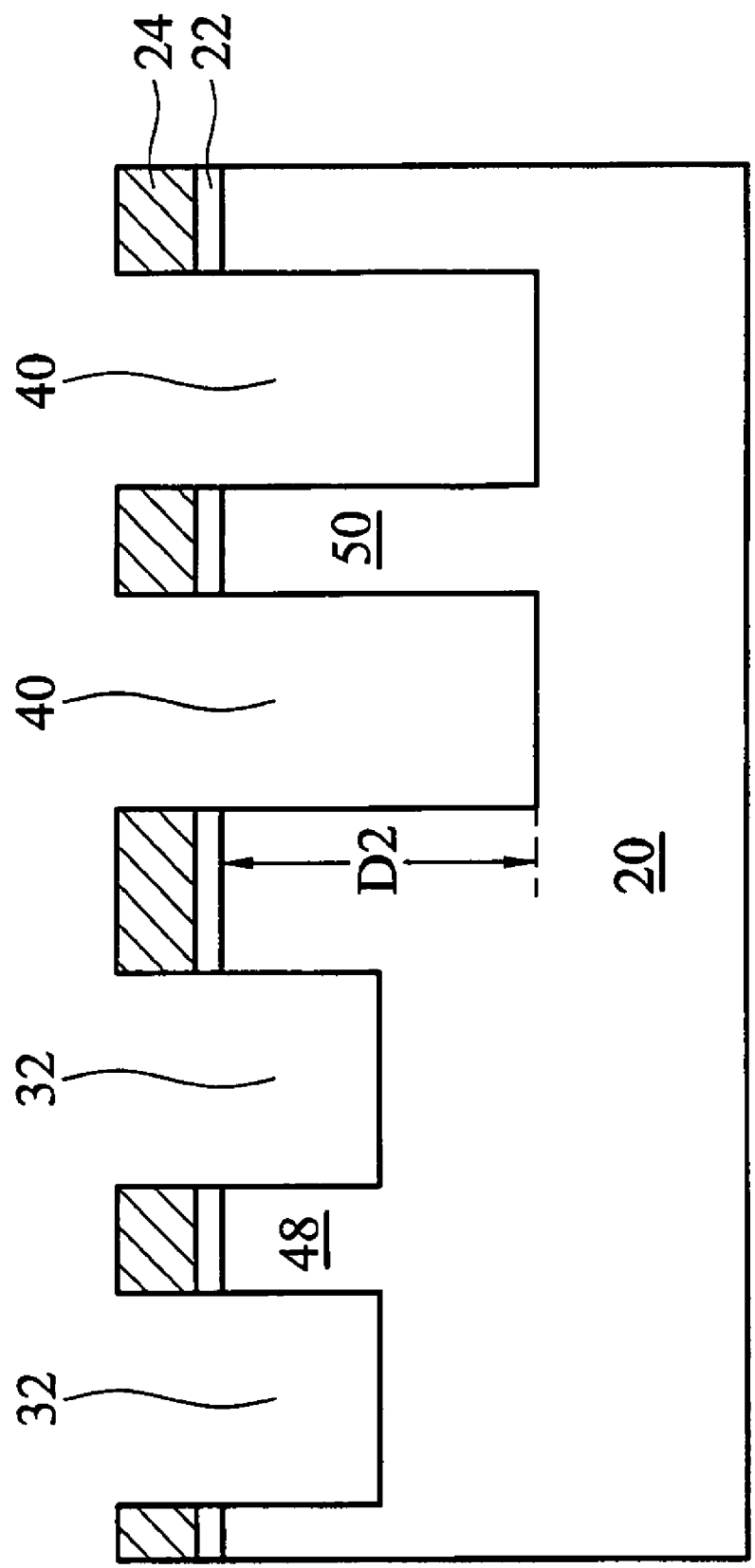

FIG. 4 illustrates the formation and patterning of photoresist 34, which defines the pattern for forming another fin. Openings 36 are formed in photoresist 34 and define photoresist strip 38, which is surrounded by openings 36. Mask layer 24, pad layer 22 and semiconductor substrate 20 exposed through openings 36 are then etched sequentially, forming trenches 40 in semiconductor substrate 20, as is shown in FIG. 5. Preferably, trenches 40 have depth D2 different from depth D1 of trenches 32. In an exemplary embodiment, trench depth D2 is greater than about 130 percent of trench depth D1, and may even be greater than about 150 percent of trench depth D1. Trenches 40 define fin 50 therebetween.

Figure 6:
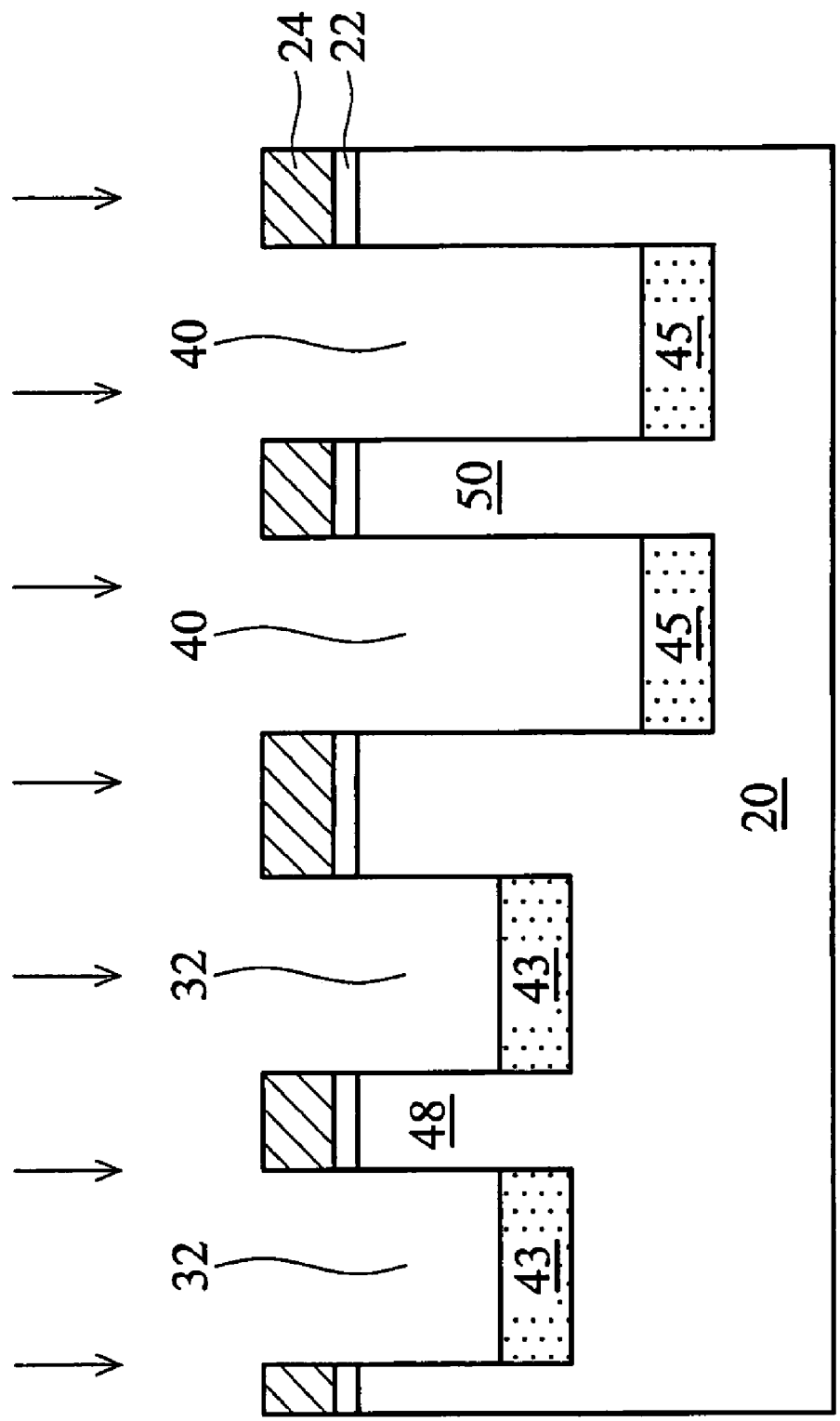
Figure 7A:
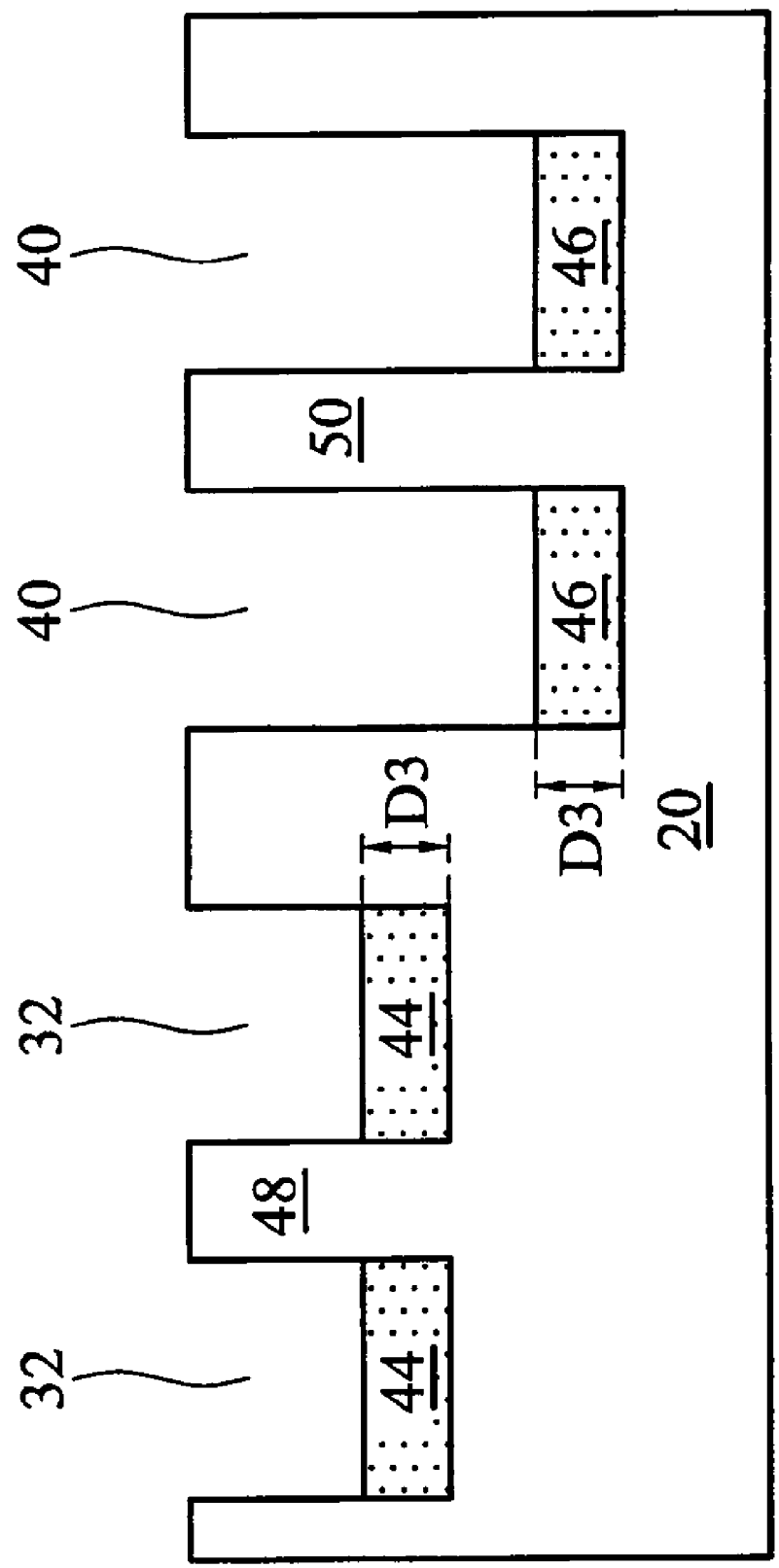

A separation by implantation of oxygen (SIMOX) is then performed to form insulating regions, as is illustrated in FIGS. 6 and 7A. Referring to FIG. 6, oxygen ions are implanted into regions 43 and 45, which are portions of semiconductor substrate 20 directly under trenches 32 and 40, respectively. In an exemplary embodiment, the oxygen implantation is performed using an energy of between about 25 keV and about 75 keV. The top surfaces of semiconductor substrate 20 are protected by mask layer 24, and thus no oxygen ions are implanted. The recessed surface of semiconductor substrate 20 in trenches 32 and 40 are exposed, and thus oxygen ions are implanted into substrate regions 43 and 45. Preferably, oxygen ions are implanted vertically, so that the resulting implanted regions 43 and 45 have substantially vertical edges. Alternatively, other dielectric forming ions, such as nitrogen ions, carbon ions may be implanted to form silicon nitride, silicon carbide, silicon carbonitride, and even silicon oxynitride, silicon oxycarbide if combined with oxygen ions.

In FIG. 7A, mask layer 24 and pad layer 22 are removed. An annealing is preformed to react oxygen ions with silicon in semiconductor substrate 20, and hence converting implanted regions 43 and 45 into silicon oxide regions 44 and 46, respectively. Although the annealing may cause silicon oxide regions 44 and 46 to be slightly extended outwards than the respective regions 43 and 45 due to diffusion, the edges of silicon oxide regions 44 and 46 are still substantially aligned to edges of fins 48 and 50, respectively. In an exemplary embodiment, the annealing is performed in an oxygen-free environment, with a preferred temperature of between about 1100° C. and about 1200° C., and for a duration of between about 60 minutes and about 120 minutes. It is noted that silicon oxide regions 44 and 46 have a same depth D3, which may be between about 2000 Å and about 2500 Å. In the resulting structure, fins 48 and 50 stand above the respective silicon oxides 44 and 46.

Figure 7B:
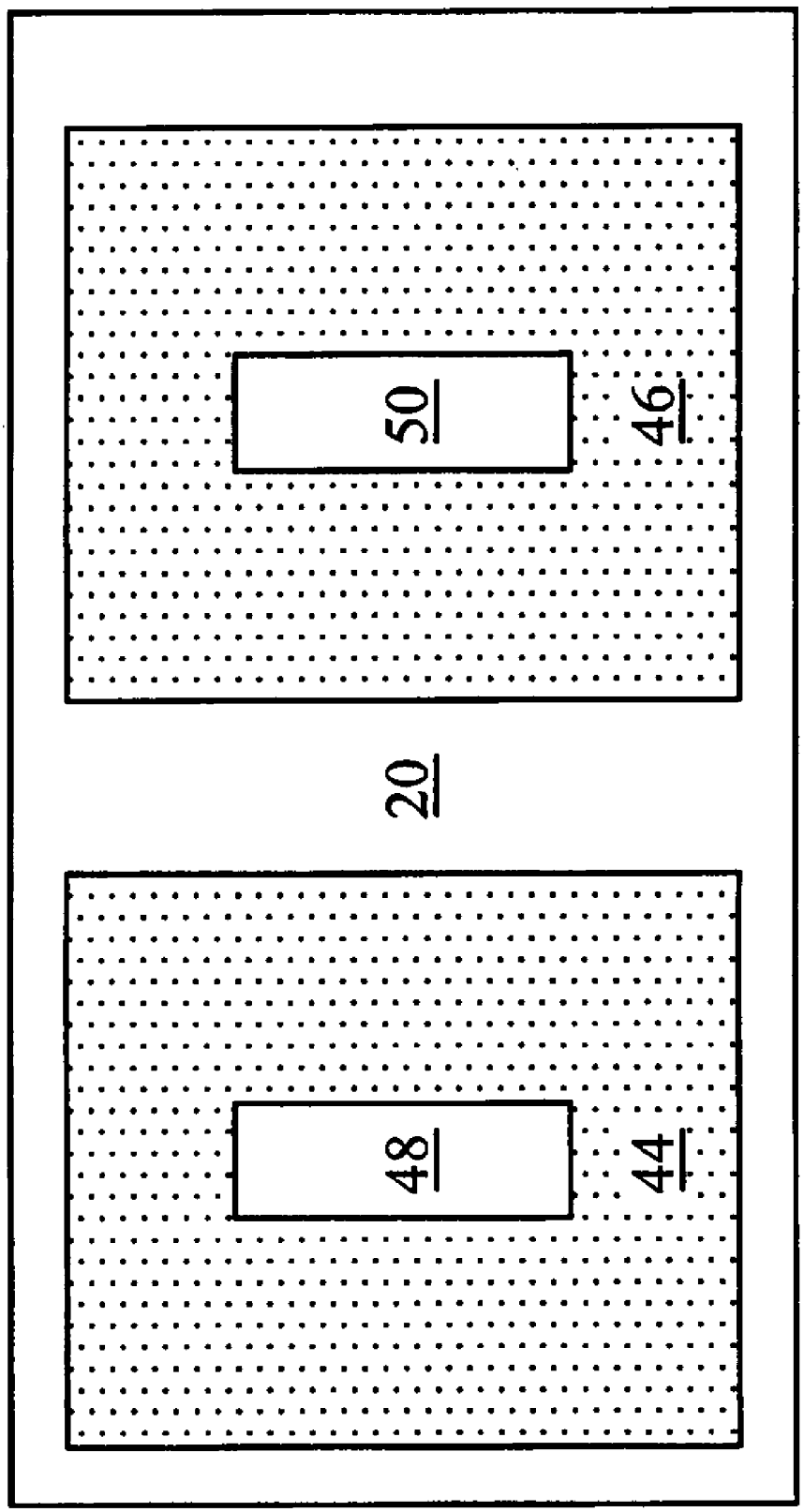
FIG. 7B is a top view of the structure shown in FIG. 7A.

A top view of the structure shown in FIG. 7A is illustrated in FIG. 7B, which illustrates fins 48 and 50 surrounded by insulating regions 44 and 46, respectively. FinFETs can thus be formed on fins 48 and 50.

Figure 8:
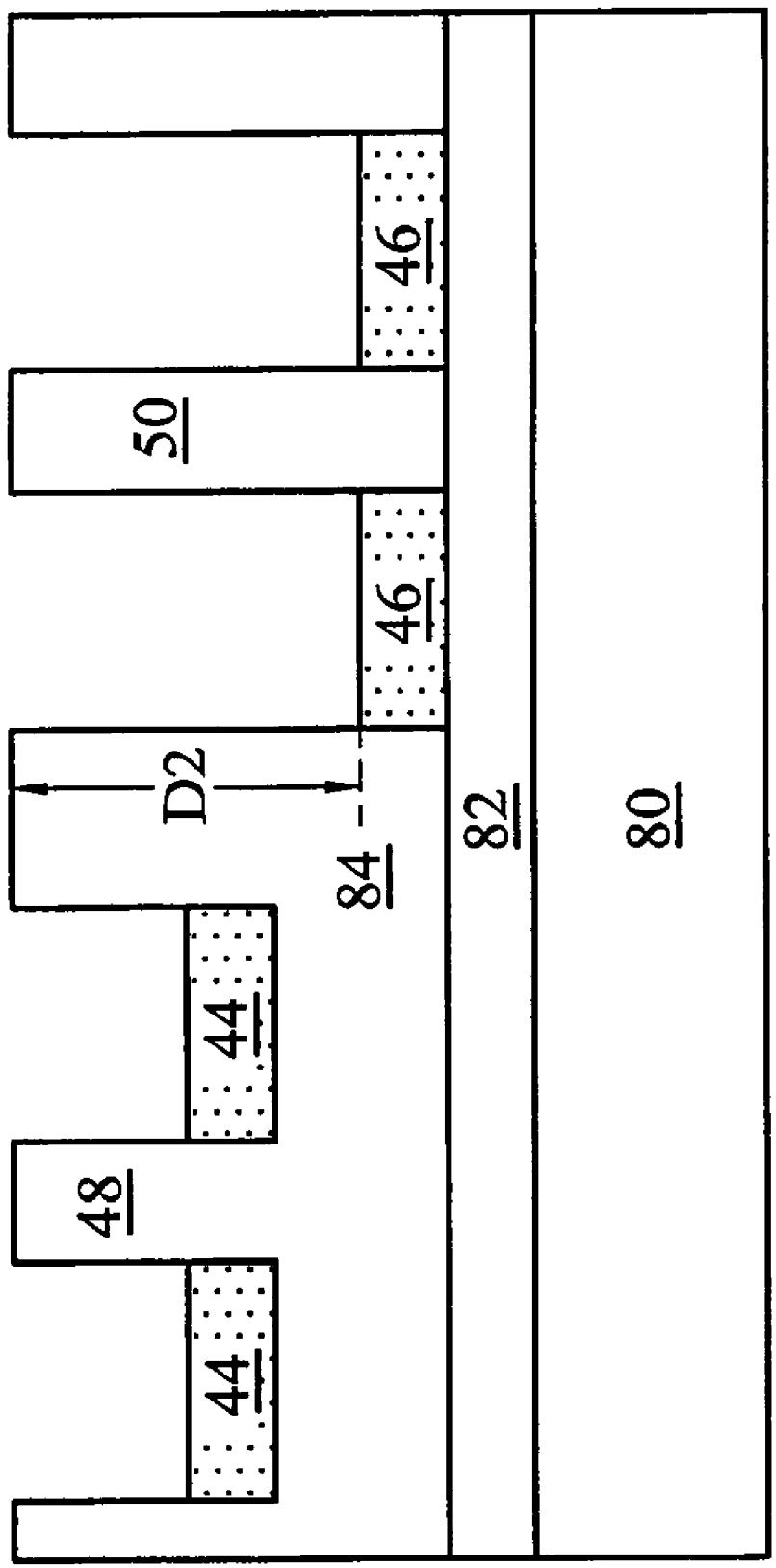
FIG. 8 illustrates an alternative embodiment of the present invention, wherein two fins with different heights are formed over a buried oxide layer.

The embodiments discussed in preceding paragraphs are formed on bulk semiconductor substrate. It is appreciated that the embodiments of the present invention may also be formed on silicon-on-insulator (SOI) structure. An exemplary embodiment is illustrated in FIG. 8. The SOI structure includes substrate 80, buried oxide layer 82 on substrate 80, and semiconductor substrate 84 on buried oxide layer 82, wherein semiconductor substrate 84 is preferably formed of essentially the same materials as semiconductor substrate 20 (refer to FIGS. 7A and 7B). In an embodiment, insulating regions 46 preferably contact buried oxide layer 82. In other embodiments, at least one of insulating regions 44 and 46, preferably both, extend into buried oxide layer 82, although in this case, since buried oxide layer 82 has already been an oxide, no silicon-implanted oxide will be formed in buried oxide layer 82. The top surfaces of insulating regions 46 may be as low as to level with the top surface of buried oxide layer 82 without undesirably reducing the desired depth D2 of fin 50.

Figure 9:
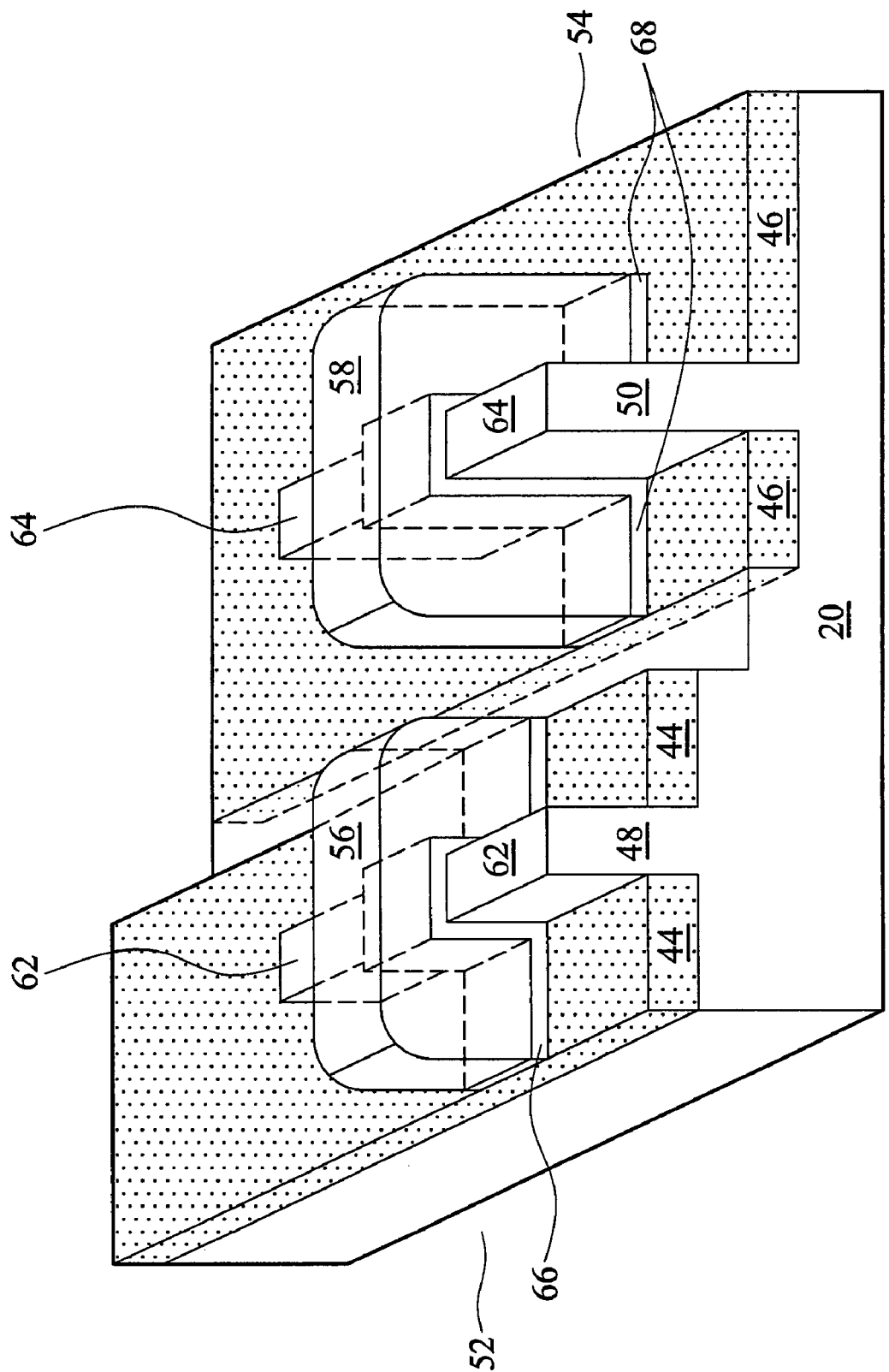
FIG. 9 illustrates a perspective view of two FinFETs with different fin heights.

FIG. 9 illustrates a perspective view of FinFETs 52 and 54 formed on the structure shown in FIGS. 7A and 7B. FinFET 52 includes gate electrode 56, source and drain regions 62, and gate dielectric 66 between gate electrode 56 and fin 48. FinFET 54 includes gate electrode 58, source and drain regions 64, and gate dielectric 68 between gate electrode 58 and fin 50.

Figure 10:
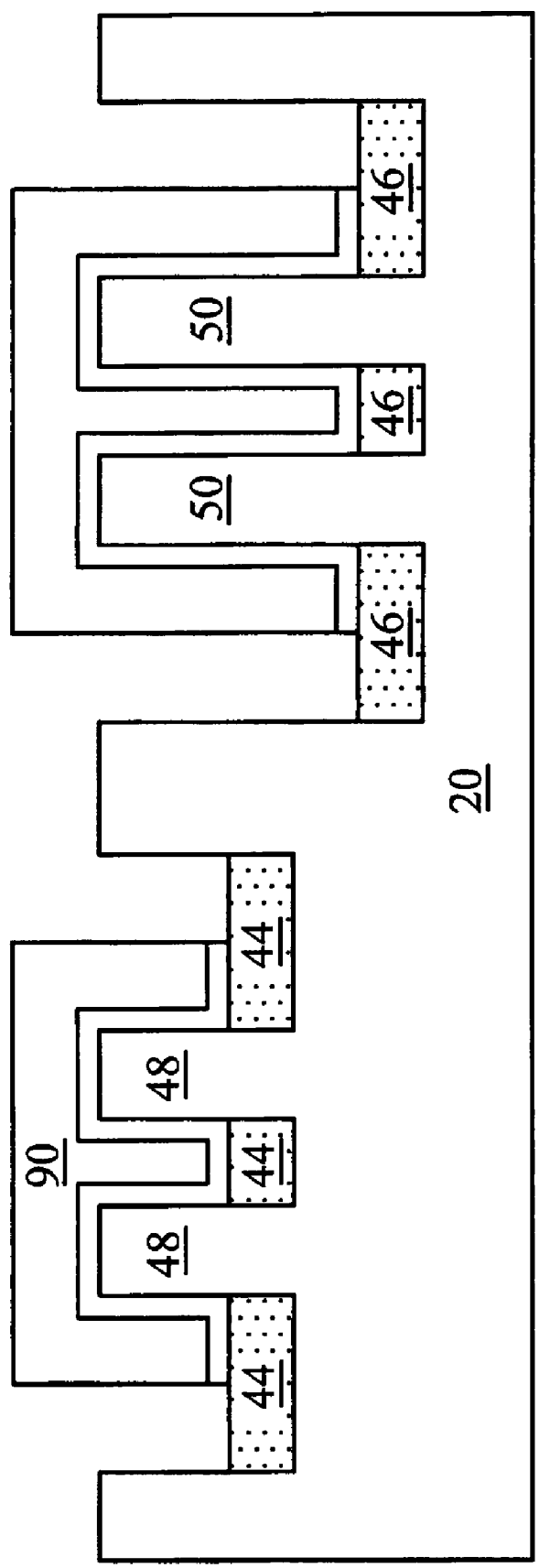
FIG. 10 illustrates an embodiment of the present invention, wherein two fins are used to form one FinFET.

It is appreciated that by using the teaching provided by the embodiments of the present invention, a semiconductor chip may have additional heights with depths different from depths D1 and D2. The fins may be spaced far from each other, so that each fin may be used for forming a FinFET. Alternatively, more than one fin may be formed close to each other, and may be used for forming a same FinFET. An exemplary embodiment is shown in FIG. 10, wherein gate electrode 90 extends over two fins 48. The source regions of the two fins 48 are connected to each other, and two drain regions of the two fins 48 are connect to each other. Accordingly, the gate width is further increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
a semiconductor substrate;
a first semiconductor strip extending from a top surface of the semiconductor substrate into the semiconductor substrate, wherein the first semiconductor strip has a first height;
a first insulating region in the semiconductor substrate and surrounding a bottom portion of the first semiconductor strip, wherein the first insulating region has a first top surface lower than a top surface of the first semiconductor strip;
a second semiconductor strip extending from the top surface of the semiconductor substrate into the semiconductor substrate, wherein the second semiconductor strip has a second height greater than the first height of the first semiconductor strip; and
a second insulating region in the semiconductor substrate and surrounding a bottom portion of the second semiconductor strip, wherein the second insulating region has a second top surface lower than the first top surface of the first insulating region, and wherein the first and the second insulating regions have substantially same thicknesses.

2. The semiconductor structure of claim 1, wherein each of the first and the second insulating regions comprises a dielectric material selected from the group consisting essentially of silicon nitride, silicon carbide, silicon carbonitride, silicon oxynitride, silicon oxycarbide, and combinations thereof.

3. The semiconductor structure of claim 1, wherein the first and the second insulating regions each have inner edges substantially vertically aligned with edges of the first and the second semiconductor strips, respectively.

4. The semiconductor structure of claim 1 further comprising:
a first gate dielectric over the top surface of the first semiconductor strip and extending on sidewalls of the first semiconductor strip;
a first gate electrode on the first gate dielectric;
a second gate dielectric over a top surface of the second semiconductor strip and extending on sidewalls of the second semiconductor strip; and
a second gate electrode on the second gate dielectric.

5. The semiconductor structure of claim 4, wherein the first gate electrode and the second gate electrode are electrically interconnected.

6. The semiconductor structure of claim 4 further comprising:
a third semiconductor strip parallel and adjacent to the first semiconductor strip, wherein the first and the third semiconductor strips are spaced apart from each other by the first insulating region, and wherein the first gate dielectric and the first gate electrode extend on a top surface and sidewalls of the third semiconductor strip; and
a fourth semiconductor strip parallel and adjacent to the second semiconductor strip, wherein the second and the fourth semiconductor strips are spaced apart from each other by the second insulating region, and wherein the second gate dielectric and the second gate electrode extend on a top surface and sidewalls of the fourth semiconductor strip.

7. The semiconductor structure of claim 4, wherein the first gate dielectric contacts sidewalls of the first semiconductor strip, and wherein a horizontal extension of the first gate dielectric extends on and contacts the first top surface of the first insulting region.

8. The semiconductor structure of claim 1, wherein the first top surface of the first insulating region and the second top surface of the second insulating region are substantially flat.

9. A semiconductor structure comprising:
a semiconductor substrate;
a first trench in the semiconductor substrate, wherein the first trench encircles a first semiconductor fin;
a first oxide region underlying the first trench;
a second trench in the semiconductor substrate, wherein the second trench encircles a second semiconductor fin, and wherein a bottom surface of the second trench is lower than a bottom surface of the first trench; and
a second oxide region underlying the second trench.

10. The semiconductor structure of claim 9, wherein the first oxide region is substantially aligned to the first trench, and wherein the second oxide region is substantially aligned to the second trench.

11. The semiconductor structure of claim 9, wherein each of the first and the second oxide regions comprises an oxide of the semiconductor substrate.

12. The semiconductor structure of claim 11, wherein the first and the second oxide regions comprise silicon oxide.

13. The semiconductor structure of claim 9, wherein the first and the second oxide regions have a substantially same thickness.

14. The semiconductor structure of claim 9 further comprising a buried oxide layer underlying the semiconductor substrate, wherein at least one of the first and the second oxide regions physically contacts the buried oxide layer.

15. The semiconductor structure of claim 9 further comprising:

a first gate dielectric over a top surface of the first semiconductor fin and extending on sidewalls of the first semiconductor fin;

a first gate electrode on the first gate dielectric;

a second gate dielectric over a top surface of the second semiconductor fin and extending on sidewalls of the second semiconductor fin; and a second gate electrode on the second gate dielectric.

16. A semiconductor chip comprising:

a semiconductor substrate having a top surface;

a first semiconductor strip in the semiconductor substrate;

a second semiconductor strip in the semiconductor substrate, wherein top surfaces of the first and the second semiconductor strips are level with the top surface of the semiconductor substrate;

a first insulating region encircling a bottom portion of the first semiconductor strip, wherein a first top edge of the first insulating region is recessed from the top surface of the semiconductor substrate by a first distance; and a second insulating region encircling a bottom portion of the second semiconductor strip, wherein a second top edge of the second insulating region is recessed from the top surface of the semiconductor substrate by a second distance greater than the first distance.

17. The semiconductor chip of claim 16, wherein the semiconductor substrate is a bulk substrate.

18. The semiconductor chip of claim 16 further comprising a buried oxide layer underlying the semiconductor substrate.

19. The semiconductor chip of claim 18, wherein a top surface of the second insulating region is above a top surface of the buried oxide layer.

20. The semiconductor chip of claim 16, wherein the first and the second insulating regions have a same thickness.

* * * * *

UNITED STATES PATENT AND TRADEMARK OFFICE
CERTIFICATE OF CORRECTION

PATENT NO. : 7,612,405 B2
APPLICATION NO. : 11/714644
DATED : November 3, 2009
INVENTOR(S) : Yu et al.

It is certified that error appears in the above-identified patent and that said Letters Patent is hereby corrected as shown below:

In Col. 4, line 26, delete "preformed" and insert --performed--.
In Col. 5, line 15, delete "connect" and insert --connected--.
In Col. 6, line 35, delete "insulting" and insert --insulating--.

Signed and Sealed this

Twenty-ninth Day of December, 2009

David J. Kappos
*Director of the United States Patent and Trademark Office*